(12) United States Patent
Neema et al.

(10) Patent No.: US 8,418,095 B1
(45) Date of Patent: Apr. 9, 2013

(54) COMPILATION AND SIMULATION OF A CIRCUIT DESIGN

(75) Inventors: Hem C. Neema, Sunnyvale, CA (US); Sonal Santan, San Jose, CA (US); Kumar Deepak, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/468,927

(22) Filed: May 10, 2012

(51) Int. Cl.
*G06F 17/50* (2006.01)

(52) U.S. Cl.
USPC .......................................... 716/103; 716/106

(58) Field of Classification Search ........... 716/100–104
See application file for complete search history.

(56) References Cited

U.S. PATENT DOCUMENTS

| 7,080,365 B2 * | 7/2006 | Broughton et al. ........... 717/146 |
| 2004/0162717 A1 | 8/2004 | Nouri et al. |
| 2005/0198606 A1 | 9/2005 | Gupta et al. |
| 2007/0245277 A1 * | 10/2007 | Chen ................................ 716/5 |
| 2010/0153083 A1 | 6/2010 | Bobok et al. |
| 2012/0233578 A1 | 9/2012 | Karlsson |

OTHER PUBLICATIONS

U.S. Appl. No. 13/347,301, filed Jan. 10, 2012, Mihalache et al.
U.S. Appl. No. 13/468,933, filed May 10, 2012, Deshpande et al.
U.S. Appl. No. 13/468,942, filed May 10, 2012, Santan et al.

* cited by examiner

*Primary Examiner* — Binh Tat
(74) *Attorney, Agent, or Firm* — LeRoy D. Maunu; Lois D. Cartier

(57) ABSTRACT

One or more embodiments provide a method of HDL simulation that determines characteristics of nets, such as shorting of nets, non-blocking assignments, etc., for the entire circuit design during compilation. Simulation code and data structures are generated for each net, individually, based on the determined characteristics of the respective net. As a result, rather than implementing code for simulation of each net capable of handling every possible combination of the characteristics, less complex code and data structures may be generated for simulation of the nets.

14 Claims, 8 Drawing Sheets

First sets of nets

Second sets of nets

COMPILATION AND SIMULATION OF A CIRCUIT DESIGN

FIELD OF THE INVENTION

One or more embodiments generally relate to the simulation of circuit designs.

BACKGROUND

Due to advancements in processing technology, complex integrated circuits (ICs) can be designed at various levels of abstraction. Using a hardware description language (HDL), circuits can be designed at the gate level, the register transfer level (RTL), and higher logical levels. When designing using an HDL, the design is often structured in a modular manner. The designer describes each module as a process describing behavior of a system, the behavior describing the generation and propagation of signals through combinatorial logic from one set of registers to another set of registers. HDLs provide a rich set of constructs to describe the functionality of a module. Modules may be combined and augmented to form even higher-level modules.

Prior to implementation, an HDL-based design can be simulated to determine whether the design will function as required. Wasted manufacturing costs due to faulty design may thereby be avoided. Numerous tools are available for simulating circuit designs including, for example, high-level modeling systems (HLMS) and HDL simulators.

Simulation of an HDL-based design includes a compilation phase and a runtime simulation phase. In the compilation phase, HDL source code is input, analyzed, and elaborated to generate executable simulation code. In the runtime simulation phase, the code generated in the compilation phase is executed by a simulation engine to simulate the design. From a user's perspective, HDL simulators work by compiling the HDL-based design once, and then executing the compiled design many times for different sets of input values during the runtime phase. Therefore, the runtime performance of HDL simulators is of critical importance and may be more important than compile time performance in many cases.

An HDL-based design is a hierarchy of modules whose behavior is described by HDL processes. When the HDL-based design is written in VHDL, an HDL process corresponds to either a VHDL process, a concurrent signal assignment, or a concurrent assertion. When the HDL-based design is written in the Verilog language, an HDL process corresponds to either a Verilog always block, an initial block, an assign statement, or a gate. Procedure calls may or may not be regarded as HDL processes. From a hardware perspective, the HDL processes represent hardware that responds to changes in inputs. For example, a change to an output of one circuit may trigger responses in multiple circuits having inputs coupled to the output.

HDL simulators schedule execution of HDL statements such that global variables or signals input to the HDL statements are properly updated and race conditions between concurrent HDL statements are avoided. Simulation of HDL processes is performed over a number of simulation cycles. Each simulation cycle begins with updates to values of nets. Each net, which may be a VHDL signal or a Verilog net, represents values transmitted on a wire of a circuit design. For ease of reference, VHDL signals and Verilog nets may be referred to as either signals or nets, and such terms are used interchangeably herein. Each update to a net may trigger a number of processes which model how a hardware implementation of the design would respond. Processes dependent on the updated nets are scheduled and executed in a delta cycle.

Depending on the circuit design, a net may be changed or updated by the output of multiple processes. Each process output that may affect the value of a net is referred to as a driver. If a process has several statements that assign values to the same net, only one driver for the net is created per process. The value of the driver is computed from all the values assigned to that net in the process, according to predefined language rules. A net that has at most one driver for each bit is said to be singly-driven. A net that has several drivers on the same set of bits is said to be multiply-driven.

When a net is driven by multiple drivers, a value of the net is determined when nets are updated at runtime using a resolution function. The value computed by the resolution function is referred to as the resolved value, and the resolved value will be assigned as the new value of the net. The process of computing the new value from the driver values of a net is called driver resolution. The resolution function can be standard, defined by the HDL language itself or, for VHDL, can be user defined.

Non-Blocking Assignments (NBAs) allow assignment of a value to a net to be scheduled to be performed, by the simulation kernel, at any point before the next simulation cycle without blocking the procedural flow. In contrast, blocking assignments require the assignment to be completed, by the simulation kernel, before continuing with simulation of other statements of a process. An NBA statement can be used whenever several variable assignments within the same simulation cycle can be made without regard to order or dependence upon each other. For instance, one example of an NBA is given by the statement, a<=b;

where the value of 'b' is assigned to 'a' but generated code should proceed to the next line before assignment actually finishes. This means that the above statement evaluates and schedules the assignment but it does not block the execution of subsequent statements in that block. This implies a sequence of statements such as:

a<=b;
b<=a;

may lead to deterministic swapping of values between 'a' and 'b'. Because the procedural flow should not be blocked for NBAs (i.e., the generated code corresponding to NBAs cannot wait to finish the effects of this construct before proceeding to the next construct), special treatment is required for correct simulation of the deterministic and indeterministic behavior of the HDL specification.

Some NBAs may be triggered by events, and different types of those NBAs may require different treatment. For instance, some NBAs are triggered by an update to a specific net. These are referred to as net-sensitive NBAs. As one example, the statement a<=@b c;

assigns the value of 'c' to 'a' (after having scheduled the assignment), in response a change in value of 'b'. As another example, the statement, a<=repeat(3) @(posedge(b) c);

waits for 3 positive edge transitions on 'b', before assigning 'c' to 'a.'

Some non-blocking assignments may include an argument that delays execution of the statement or delays assignments performed by the statements. For instance, in the set of statements:

```
initial begin
    d<=#10 1;
    e<=#2 0;
    f<=#4 1;
end
``` d is scheduled to be assigned 1 at time 10, e is scheduled to be assigned 0 at time 2, and f is scheduled to be assigned 1 at time 4. Due to the different treatment required for simulation of different NBA scenarios, simulation of NBAs can be challenging.

To add further complexity, HDL languages are capable of defining formals of ports to link together multiple nets. This has the effect of shorting net actuals together. Some previous approaches model each shorted net separately, using a separate memory locations to store driver and net values of the different shorted nets. The nets are configured to be sensitive to each other such that an update of a net value of one of the shorted nets will cause other memory locations of ones of the shorted nets to be updated as well. This separate processing of the nets is inefficient. Further, whole nets are not always shorted together. Rather, individual bits of a net may be shorted together while other bits of the nets are not. This requires previous approaches to update each of the shorted nets in a bitwise manner which can further increase computational complexity.

One or more embodiments may address one or more of the above issues.

SUMMARY

In one embodiment, a method of compiling an HDL specification for simulation of a circuit design is provided. Using one or more processors, the circuit design is elaborated from the HDL specification and non-blocking assignments in the elaborated circuit design are determined. For each net to which one or more of the non-blocking assignments are sensitive, a corresponding data structure indicating each non-blocking assignment sensitive to the net is created. Simulation code that models the circuit design is generated. For each net to which one or more of the non-blocking assignments are sensitive, the simulation code is configured to add the data structure corresponding to the net to a list in response to the net being updated in a cycle of simulation during simulation runtime. In response to completing the cycle of simulation, the simulation code is configured, for each of the data structures in the list, to perform each non-blocking assignment indicated by the data structure and remove the data structure from the list.

In another embodiment, a method of compiling an HDL specification for simulation of a circuit design is provided. Using one or more processors, the circuit design is elaborated from the HDL specification. For each instance of a module in which two or more nets are shorted together by the module, a respective first set of nets shorted by the instance is determined. The first sets of nets is converted into second sets of nets, where ones of the first sets having nets in common with each other are merged into one of the second sets of nets. For each second set of nets, a respective memory location is assigned to store a value of the set of nets at runtime. Simulation code that models the circuit design is generated. During simulation runtime, for each net in the second sets of nets, the simulation code is configured to store a value of the net in the memory location assigned to the corresponding one of the second sets of nets and first set of nets that is not merged that includes the net.

In yet another embodiment, a method of compiling an HDL specification for simulation of a circuit design is provided. Using one or more processors, the circuit design is elaborated from the HDL specification. Non-blocking assignments in the elaborated circuit design are determined. For each net to which one or more of the non-blocking assignments are sensitive, a corresponding data structure indicating each non-blocking assignment sensitive to the net is created. In addition, for each instance of a module in which two or more nets are shorted together by the module in the elaborated circuit design, a respective first set of nets shorted by the instance is determined. The first sets of nets is converted into second sets of nets, where ones of the first sets having nets in common with each other are merged into one of the second sets of nets. For each second set of nets, a respective memory location is assigned to store a value of the set of nets at runtime.

Simulation code that models the circuit design is generated. During simulation runtime, for each net in the second sets of nets, the simulation code is configured to store a value of the net in the memory location assigned to the corresponding to the one of the second sets of nets that is not merged that includes the net. For each net to which one or more of the non-blocking assignments are sensitive, the simulation code is also configured to add the data structure corresponding to the net to a list in response to the net being updated in a cycle of simulation during simulation runtime. In response to completing the cycle of simulation, the simulation code is configured, for each of the data structures in the list, to perform each non-blocking assignment indicated by the data structure and remove the data structure from the list. During simulation runtime, for each net in the second sets of nets, the simulation code is configured to store a value of the net in the memory location assigned to the corresponding one of the second sets.

It will be appreciated that various other embodiments are set forth in the Detailed Description and Claims, which follow.

BRIEF DESCRIPTION OF THE DRAWINGS

Various aspects and advantages of the disclosed embodiments will become apparent upon review of the following detailed description and upon reference to the drawings, in which:

FIG. 5-1 shows a table of first nets having two or more actuals shorted together, in accordance with one or more embodiments;

FIG. 5-2 illustrates merging of the first nets having common actuals to produce a table of second nets, in accordance with one or more embodiments;

FIGS. 6-1 through 6-5 illustrate a process for merging first sets of the table shown in FIG. 5-1 to produce merged second sets of nets shown in the table of FIG. 5-2, in accordance with one or more embodiments.

DETAILED DESCRIPTION

In one or more embodiments, a memory and run-time efficient method for compilation and simulation of different types of NBAs is provided. During compilation, a circuit design indicated by an HDL specification is elaborated and NBAs are identified. For each net that triggers a net-sensitive NBA, a data structure is generated that indicates NBAs sensitive to the net. During simulation runtime, in response to an update of one of the nets triggering a net-sensitive NBA, the NBAs indicated by the corresponding data structure are scheduled to be performed at the end of the simulation cycle. The determination and indexing of net-sensitive NBAs by nets during compilation simplifies scheduling of net-sensitive NBAs during simulation.

Figure 1:
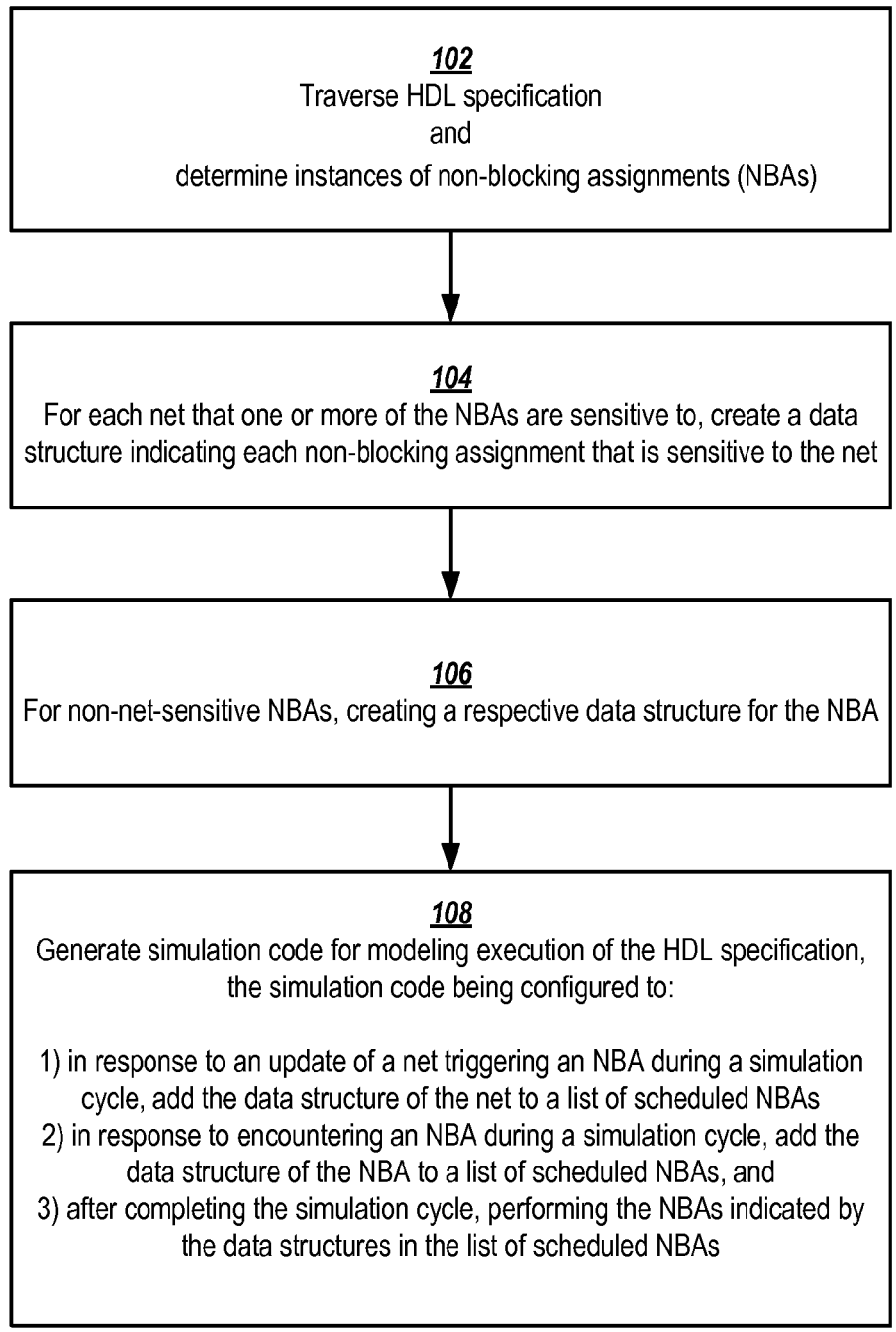
FIG. 1 shows a process for compiling an HDL specification having NBA, in accordance with one or more embodiments.

FIG. 1 shows a process for compiling an HDL specification having NBAs, in accordance with one or more embodiments. An HDL circuit design specification is traversed and NBAs are identified at block 102. For each net that the NBAs are sensitive to, a data structure is created for the net at block 104. The data structure indicates the NBAs that are sensitive to the net. For each NBA that is not sensitive to a net (non-net-sensitive NBA), a respective data structure is created at block 106. Simulation code that models execution the HDL specification is generated at block 108. The simulation code is configured to, in response to a change in a net that affects one of the net-sensitive NBAs, schedule the NBAs indicated by the corresponding data structure of the net. The simulation code is also configured to schedule non-net-sensitive NBAs when encountered during a simulation cycle. As indicated above, NBAs allow assignment of a value to a net to be performed, by the simulation kernel, at any point before the next simulation cycle without interrupting simulation flow. In some embodiments, triggered NBAs may be scheduled by the triggered NBAs to a list. The NBAs indicated in the list may be performed by the simulation kernel at any point before the next simulation cycle. In some implementations, the NBAs are performed at the end of the simulation cycle after nets have been updated and processes have been simulated for the delta cycle. This implementation simplifies NBA execution because no more NBAs will be encountered/triggered in the simulation cycle, allowing NBAs to be processed as a batch.

Figure 2:
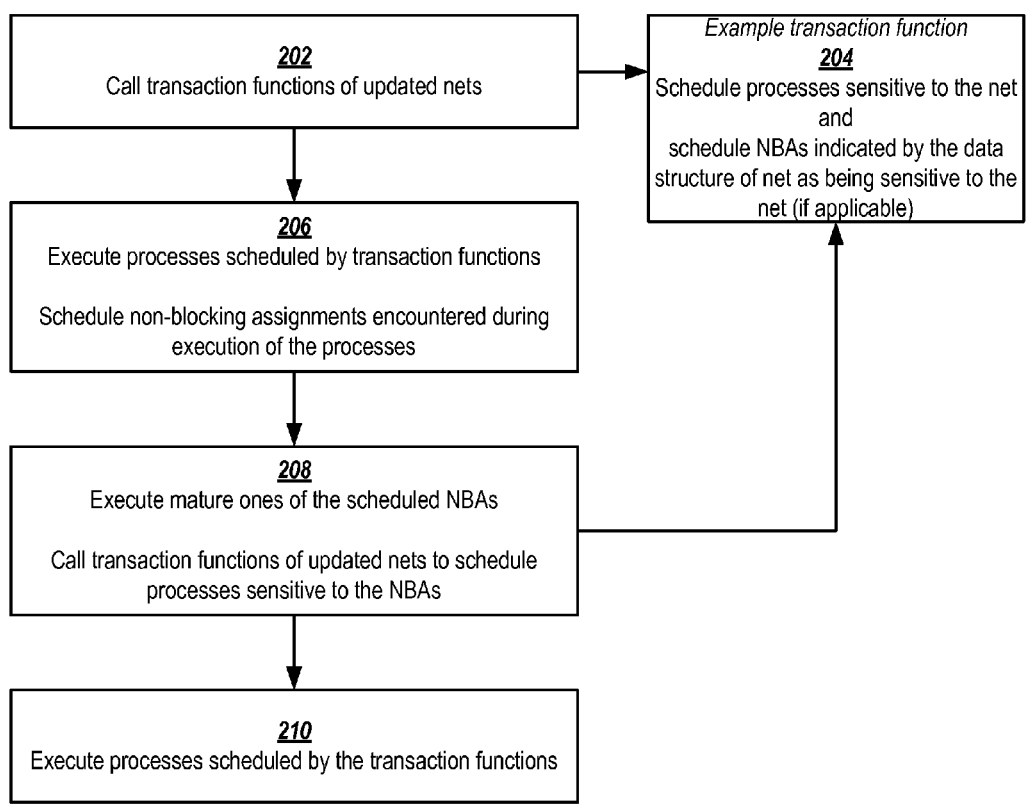
FIG. 2 shows a process for efficient simulation of NBA, in accordance with one or more embodiments.

FIG. 2 shows a process for efficient simulation of NBAs, in accordance with one or more embodiments. A transaction function for a net is called at 202 in response to update of the net. An example transaction function is shown at block 204. The transaction function 204 is configured to schedule processes, and NBAs (if applicable), that are sensitive to the updated net. Processes scheduled by the transaction functions are executed at block 206. NBAs encountered during execution of the processes are also scheduled at block 206.

Mature ones of the scheduled NBAs are executed at block 208. A mature NBA refers to either an NBA that does not include a delay or to a previously scheduled NBA that was delayed for execution until the current simulation cycle. Some of the NBA statements scheduled at either blocks 204 and 206 may be configured for execution in the same simulation cycle and other ones of the scheduled NBA statements may be configured to be delayed until a subsequent simulation cycle. For instance, in one embodiment, NBA statements scheduled at blocks 204 or 206 that are not delayed (i.e., to be performed in the current simulation cycle) are added to a first list. NBA statements that are scheduled by blocks 204 and 206, and which are to be delayed for one or more simulation cycles, are added to a second list. NBA statements included in the first list are performed at block 208 along with ones of the NBA statements of the second list in which the delay has matured. Transaction functions of nets updated by the NBA statements are also called at block 208. Processes triggered by the executed NBA statements (e.g., scheduled by the transaction functions) are performed at block 210.

In some implementations, scheduled net-sensitive NBAs may be created and maintained as a linked list. For instance, as discussed with reference to FIG. 1, data structures created for nets during compilation indicate NBAs sensitive to the respective nets. The transaction function generated during compilation (e.g., 204) for such a net is configured to add the corresponding data structure to a linked list. Scheduled NBAs are performed at block 208 by traversing the linked list and, for each data structure in the linked list, performing the NBAs indicated by the data structure.

Figure 3:
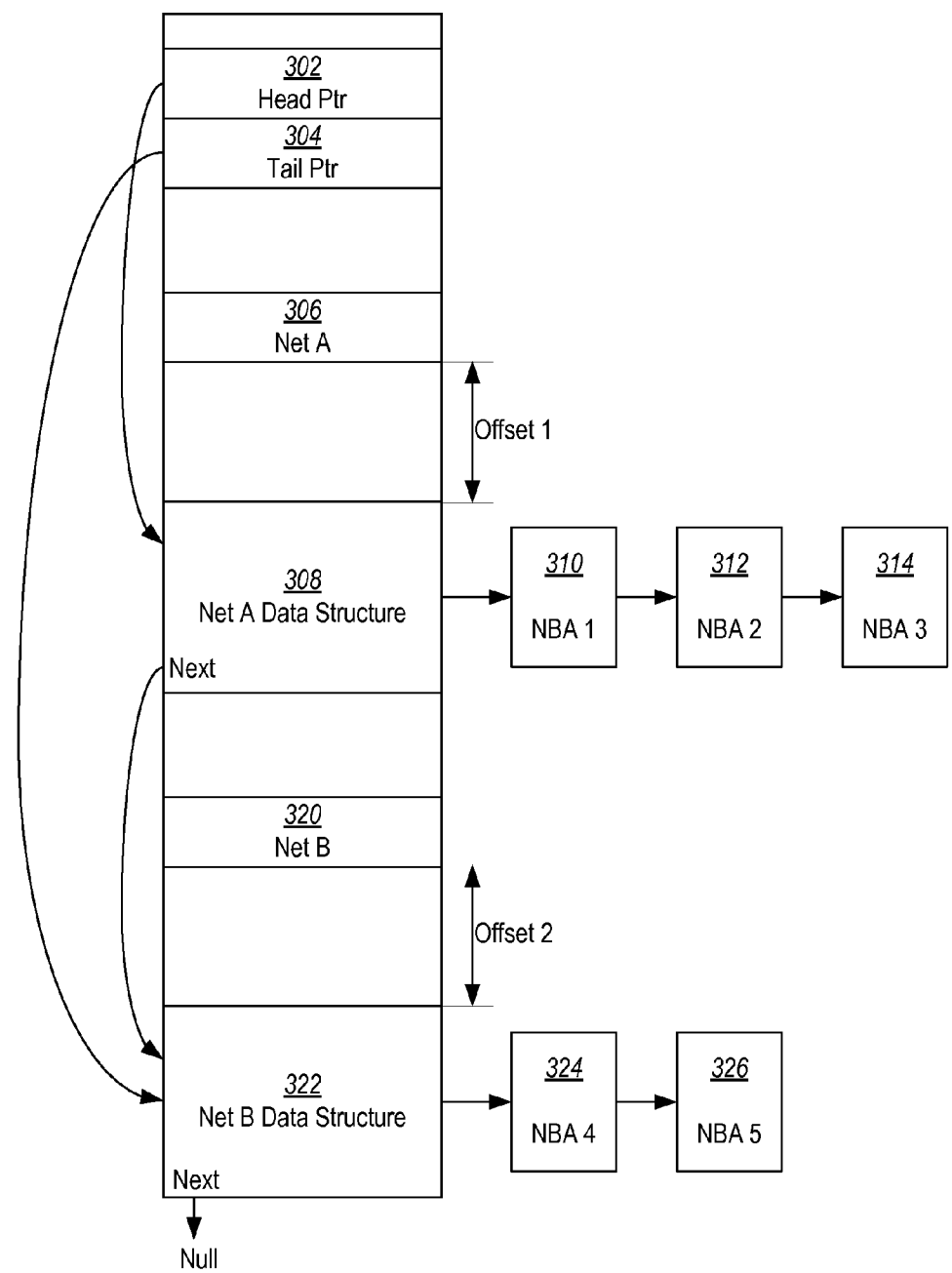
FIG. 3 illustrates an example linked list constructed at runtime to maintain a list of scheduled NBAs, in accordance with one or more embodiments.

FIG. 3 illustrates an example linked list constructed at runtime to maintain a list of scheduled NBAs, in accordance with one or more embodiments. In this example, the linked list includes a head reference pointer 302 and a tail reference pointer 304 implemented in respective locations of a memory. For each net identified as triggering NBAs (e.g., 306 and 320), a memory location is allocated at compile time for a respective data structure (e.g., 308 and 322).

As discussed with reference to FIG. 2, a transaction function, generated for a net during compilation, is configured to schedule NBAs sensitive to the net by adding a data structure indicating the sensitive NBAs to a linked list in response to an update of the net. In this example, if the list is empty (e.g., head pointer 302 and tail pointer 304 are NULL), one of the data structures (e.g., 308) is added to the list by pointing the head and tail pointers 302 and 304 to the data structure. For each subsequent data structure to be added to the list (e.g., 322), a "next" reference pointer of the data structure at the tail of the list, and the tail pointer 304 are pointed to the newly added data structure. The linked list may be traversed at block 208 of FIG. 2 to execute the NBAs indicated by the data structures included in the linked list.

In some embodiments, the memory may be allocated for the data structures, (e.g., 308 and 322) indicating NBAs sensitive to the corresponding nets (e.g., 306 and 320), at a certain offset in corresponding blocks of memory for the nets (e.g., offset 1 and offset 2, respectively). The allocation of a contiguous block of memory for storage of data associated with the net (e.g., net values, driver value, data structures, etc.) improves locality of reference and reduces memory accesses that are required during simulation.

In different embodiments, the data structure may store data indicating the NBAs in a number of alternative formats. In one implementation, as shown in FIG. 3, each data structure includes a reference pointer to a second linked list of the corresponding NBAs. For example, data structure 308, which corresponds to net A (306), includes a reference pointer to a linked list, and that linked list includes the NBAs 310, 312, and 314 that are sensitive to net A. As another example, data structure 322, corresponding to net B (320), includes a reference pointer to a linked list including NBAs 324 and 326.

In one or more embodiments, a memory and run-time efficient methods for compilation and simulation of HDL circuit designs having shorted nets are provided. HDL languages are capable of defining formals of ports to link together multiple nets. This has the effect of shorting net actuals together. One or more embodiments identify shorted nets during compilation and generate simulation code that implements shorted bits of nets using a single respective memory location.

Verilog HDL allows a module definition with multiple formals having the same name, as illustrated by the following pseudo-code segment:

module m(f, f);
inout f;
endmodule

This implies that by instantiating the module 'm,' two net actuals may be shorted together. For instance, the following pseudo-code segment shorts net actuals w1 and w2 together:

module tb1;
        wire w1, w2;
        m dut(w1, w2);
    endmodule

Because they are shorted, actuals 'w1', 'w2' and the formal T should always have the same value and driving any one of them (e.g., assign w1=r) is equivalent to driving any of the other shorted actuals. For instance, in module 'tb1', assignment 'w1=r' would be interchangeable with assignment 'w2=r'. All HDL statements that operate on 'w1', 'w2' or T (e.g., to query values, to write values or conditional break points, etc.) may use 'w1', 'w2', or T interchangeably during simulation.

As indicated above, individual bits of two nets may be shorted together without shorting the nets as a whole. For instance, different bits of many different nets may be shorted by calling multiple instances of module 'm', as shown in the following code segment:

module tb2;
        wire [1:0] w1, w2, w3;
        m dut1(w1[1], w2[0]); //First instance shorts w1[1] and w2[0]
        m dut2(w3[1], w1[1]); //Shorts w3[1] and w1[1];
    endmodule In this example, because 'w1[1]' is already shorted to 'w2[0]' via the first instantiation of 'm (dut1)', the second instantiation of 'm (dut2)' effectively shorts 'w3[1]' together with 'w1[1]' and 'w2[0]'. The other bits of 'w1', 'w2', or 'w3', in this example, are floating (nothing driving them). There are many other possibilities including instantiations (and hence shorting) of signals at different hierarchical levels of the HDL circuit design.

In one embodiment, an HDL specification of a circuit design is traversed during compilation to identify each instance in which two nets are shorted together. In one particular implementation, identified instances of shorted nets are arranged in a table. The table is processed to determine mutually exclusive groups of nets that are shorted together. Based on this information, simulation code is generated that implements each group of shorted nets as a respective single net during simulation. As a result, additional processing for shorted nets is not required during simulation. In this manner simulation efficiency is increased.

Figure 4:
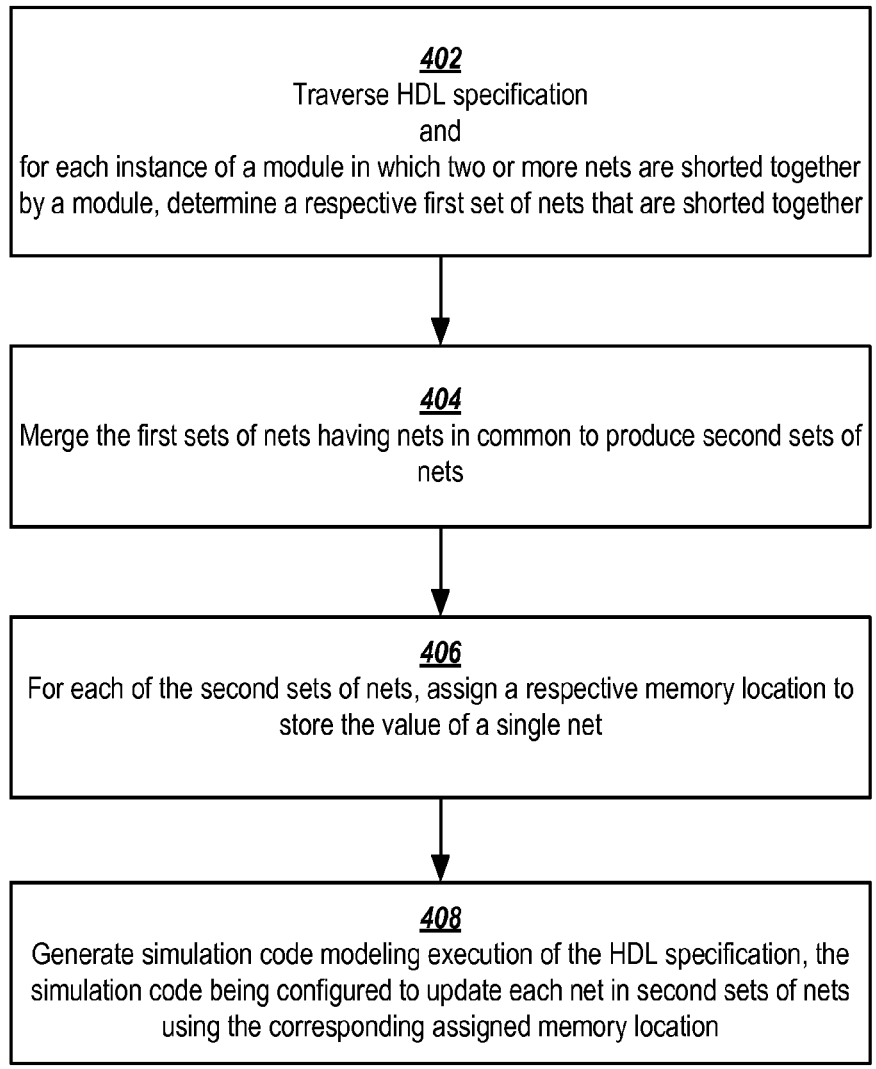
FIG. 4 shows a process for compiling an HDL specification having shorted nets for HDL simulation, in accordance with one or more embodiments.

FIG. 4 shows a process for compiling an HDL specification having shorted nets, in accordance with one or more embodiments. An HDL specification of a circuit design is traversed at block 402 and, for each instance of a module in which two or more nets are shorted together, a respective first set of nets that are shorted together in that module is determined. Second sets of nets are determined from the first sets of nets at block 404. The second sets of nets include each of the first sets of nets, with ones of the first sets of nets having nets in common merged together (an example is provided in FIGS. 5-1 and 5-2). For each of the second sets of nets, a respective memory area is assigned for data storage of a single net value at block 406 during simulation runtime. Simulation code is generated at block 408. The simulation code is configured to update each net in the second set of nets during simulation using the corresponding assigned memory location.

In some embodiments, to determine shorted nets during compilation, each actual is represented as a Net Slice Range (NSR). An NSR has a reference pointer to the net, and has information about the bit range within that net. For example, for an actual 'w1[1]', the NSR includes a reference pointer to the net 'w1' and the indices 1, 1 to the actual (both start index and end index are 1). In one implementation, each NSR may be implemented using the following data structure:

struct NSR{
        Net* m_topNet; //represents a pointer to w1
        t_unsignedPair p; //has 2 integers, 1 and 1 in this case
    };

As shorted nets are encountered during traversal of the HDL specification, NSRs are generated for each of the shorted actuals and formals and are added as an entry to a table of NSRs. The table is indexed by the formal of the shorting module (e.g., T of module 'm (f, f)'). As explained in more detail below, an algorithm may efficiently determine which groups of nets in the table of NSR are shorted together and need to be merged.

For illustrative purposes, the process of determining groups of nets shorted together is described with reference to the HDL pseudo-code segment shown in Example 1.

module m(f,f);
        inout f;
    endmodule;
    module tb( );
        wire wa, wb, wc, wd, we, wf, wg, wh, wi, wj;
        m dut0(wa, wb);
        m dut1(wc, wd);
        m dut2(we, wb);
        m dut3(wf, wg);
        m dut4(wh, wi);
        m dut5(wj, we);
    endmodule;

EXAMPLE 1

In Example 1, module 'tb' instantiates module m six different times with different pairs of actuals. Module m is declared in a way that will cause shorting (i.e., module m(f, f)) between the actuals.

Figures 1, 5:
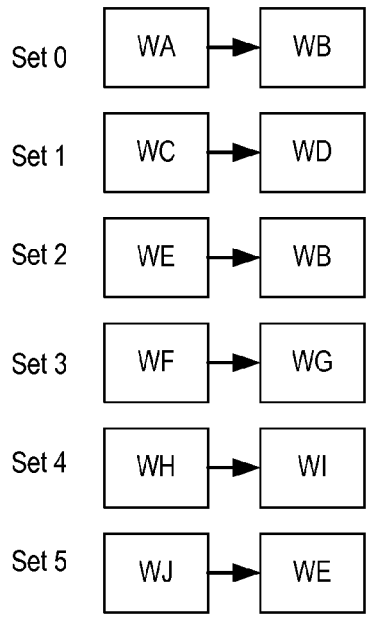
Figures 2, 5:
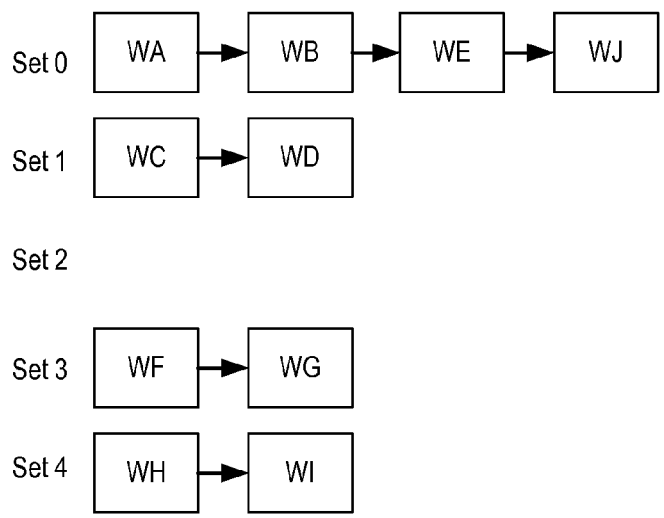

FIGS. 5-1 and 5-2 illustrate identification and merging of the nets shown in Example 1 that are shorted together. FIG. 5-1 shows a table of first nets having two or more actuals shorted together (e.g., those identified at block 402 of FIG. 4). With reference to Example 1, the table shown in FIG. 5-1 includes 6 sets of nets ('WA'+'WB', 'WC'+'WD', 'WE'+'WB', 'WF'+'WG', 'WH'+'WI', and 'WJ'+'WE') that are shorted together by respective instances of module 'm'. Nets 'WA', 'WB', 'WE', and 'WJ' are effectively shorted together because the sets 0 and 2 are connected by net 'WB', and sets 2 and 5 are connected by net 'WE'.

FIG. 5-2 shows a table of second nets, such as those generated at block 404 of FIG. 4, where the first sets of nets shown in FIG. 5-1 that have common nets are merged. In this case, the first sets 0, 2, and 5 shown in FIG. 5-1 have been merged into set 0 in the second sets of nets shown in FIG. 5-2. The merging process removes sets 2 and 5 from the table and concatenates the removed sets 2 and 5 with set 0. The concatenated sets are then reduced to remove redundant elements 'WE' and 'WB' to produce the table shown in FIG. 5-2.

Figures 1, 6:
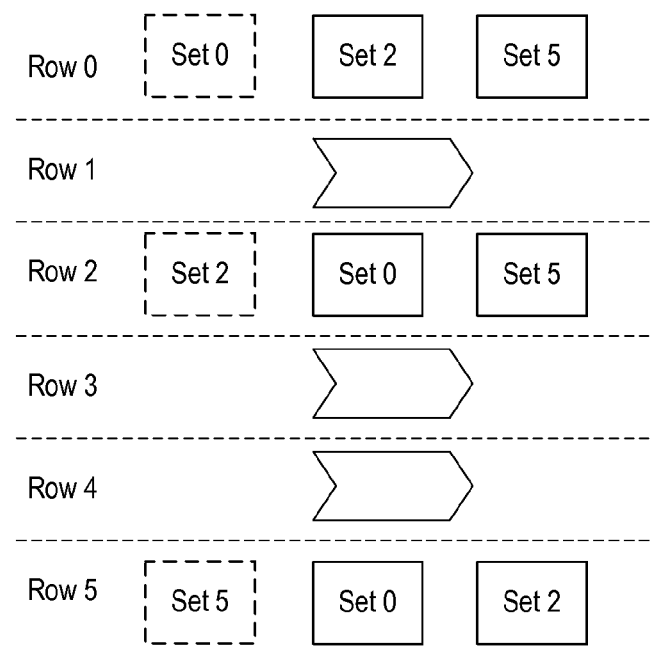
Figures 2, 6:
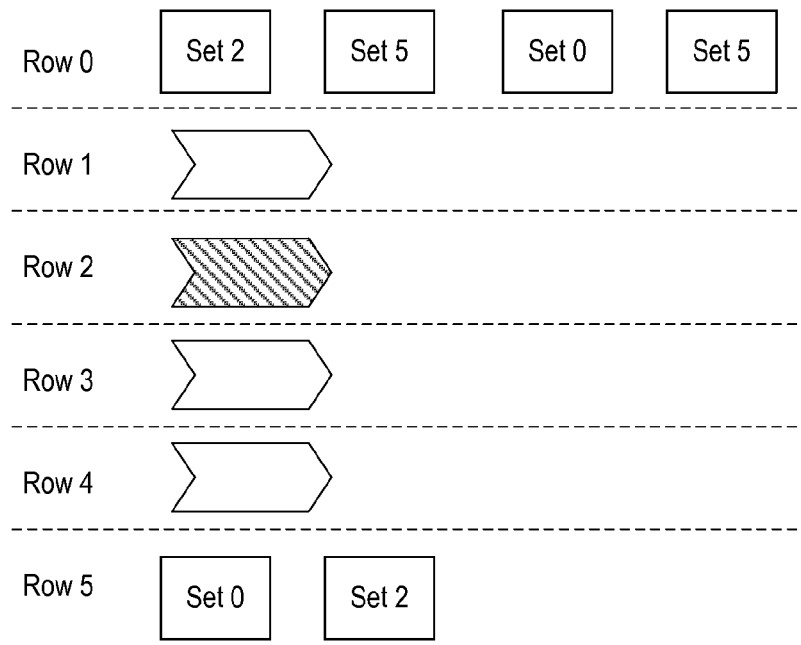
Figures 3, 6:
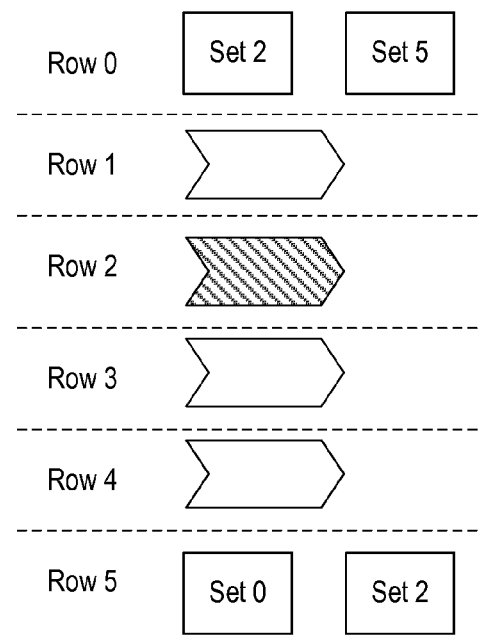
Figures 4, 6:
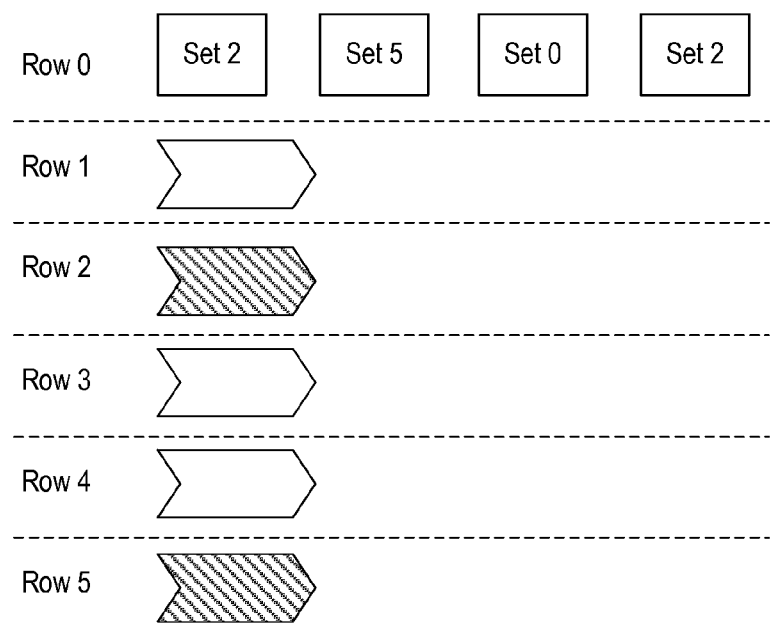
Figures 5, 6:
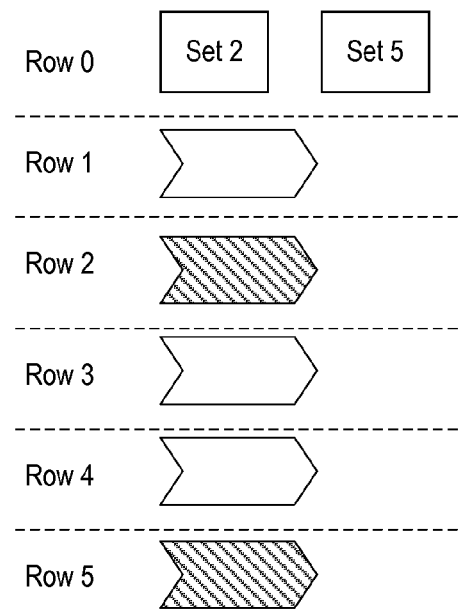

FIGS. 6-1 through 6-5 illustrate a process for merging first sets of the table shown in FIG. 5-1 to produce merged second sets of nets shown in the table of FIG. 5-2. FIG. 6-1 shows an intermediate table that represents data of the table shown in FIG. 5-1 that is reformatted for ease of processing. In the intermediate tables, each row index corresponds to a respective set in the FIG. 5-1 table. For instance, row index 0 in FIG.

6-1 corresponds to set 0 in FIG. 5-1. For each other set in FIG. 5-1 that has an NSR in common with set 0 (e.g., set 2 and set 5), an entry (representing the set) is added at row index 0 in FIG. 6-1. Similarly, row 2 in FIG. 6-1 includes entries for sets 0 and 5 because sets 0 and 5 have common NSRs with set 2 in FIG. 5-1. Once the intermediate table is completed, rows having entries indicate rows that need to be merged. In this example, rows 0, 2, 5 need merging and rows 1, 3, 4 do not require merging.

The intermediate table is then traversed to incrementally combine and reduce the remaining table entries. For each row in the intermediate table (skipping the first row), merging is performed by moving entries of the row to the row having the same index as the first set in the row. For instance, in traversal of the intermediate table, row 2 is the first row encountered having set entries. FIG. 6-2 shows row 2 is added to row 0 of the intermediate table, because set 0 was the first entry in row 2. FIG. 6-3 shows row 0 having been reduced to remove redundant sets in the row. In this example, set 0 added in FIG. 6-2 is already represented by the row index 0 and, thus, is removed as redundant in FIG. 6-3. Set 5 is also removed as redundant because row 0 already includes set 5. Continuing traversal of the intermediate table (FIG. 6.2), row 5 is the next row encountered having set entries. FIG. 6-4 shows the sets identified in row 5 having been added to row 0 of the intermediate table. In response to adding the sets of row 5 to row 0, row 0 is again reduced to remove redundant sets. Sets 0 and 2 are redundant because set 2 is already included in row 0 and set 0 is implicitly represented by the index of row 0. FIG. 6-5 shows row 0 again reduced to remove the redundant sets. Once the intermediate table has been fully traversed, remaining entries in the table indicate the first sets of the table shown in FIG. 5-1 that need to be merged to produce the table shown in FIG. 5-2.

The identified groups of shorted nets can be connected by a complex arrangement of module instantiations located in various hierarchical levels of the circuit design. To generate efficient simulation code, one or more embodiments flatten the hierarchy of the nets to directly map the formals and actuals of shorted nets without any intervening connections. In one implementation, flattening of nets is accomplished by connecting the NSRs of the table shown in, e.g., FIG. 5-2 in a hierarchy of parent and child NSRs and rearranging the connections between the NSR data structures to reduce depth of the hierarchy. For ease of reference, a formal shorting of two or more actuals may be referred to as a heterogeneous net, and a formal connected to only one actual may be referred to as a homogeneous net. Similarly, an actual connected to a heterogeneous net may be referred to as a heterogeneous element, and an actual connected to a homogeneous net may be referred to as a homogeneous element. For instance, in the HDL pseudo-code segment shown in Example 2, formal T is a heterogeneous net shorting heterogeneous elements 'w1' and 'w2'. Heterogeneous element 'w2' is also linked to homogeneous net g.

```
module m(f,f);
    inout f;
endmodule;
module n(g);
    inout g;
endmodule;
module tc( );
    wire w1; w2;
    m (w1, w2);
    n (w1);
```

EXAMPLE 2

The hierarchy of NSRs is modified to satisfy the following criteria:
1) NSR corresponding to a heterogeneous element can only include NSRs that are homogeneous nets; and
2) None of the heterogeneous nets cover a bit range, which is not covered by a heterogeneous element.

For each of the second sets of nets shown in the table of FIG. 5-2, one NSR is configured as the parent NSR ($P_{NSR}$), and other NSRs corresponding to heterogeneous elements in the second set are configured to be children of the parent NSR.

Modification to the hierarchy of NSRs may create conflict with the above criteria (due to children of the selected NSR), which requires further modification of the hierarchy for the children of the selected NSR. In one potential scenario, the NSR selected to be the $P_{NSR}$ could include heterogeneous nets as children. In this scenario, NSRs for the child heterogeneous nets are added to the set of nets and analyzed for compliance with the above criteria along with other NSRs in the set. In another scenario, the NSRs selected to be become a child of the $P_{NSR}$ might include one or more heterogeneous nets as children. In this scenario, the child homogeneous nets (connected to the heterogeneous_element) are converted to become heterogeneous nets of the $P_{NSR}$'s net. In another scenario, the selected NSR may be a homogeneous net. In this case, any child heterogeneous elements connected to the homogeneous net are modified to become child heterogeneous elements of $P_{NSR}$ rather than child elements of the selected NSR.

Example pseudo code to perform the modification to the hierarchy of NSRs is provided in Example 3.

```
main( ){
    for_each_nsr_in_a_row {
        skip_first_nsr;
        //Take care of 'a' above. Make nsr the HNSR of first-
            _nsr.
        //Populate a list of nets that have newly become het-
            erogeneous nets
        nsr->findNetsAndAddHeterogeneousElements(a_l-
            ist_of nets, first_nsr);
        //for each new heterogeneous net
        for_each_net_x (a_list_of nets) {
            //Ensure (assumption II) above
            x->fill_unconnected_indices_for_het-
                erogeneous_nets;
            //Take care of 'b"c' and 'd' above. Details in the next
                figure
            x->migrate_heterogeneous_elements( );
        }
    }
}
Net::migrate_heterogeneous_elements( ){
//This was a homogeneous net, it has just now become an
    heterogeneous net,
//with all its ranges covered. Existing heterogeneous nets
    that have this net as
//their parent need to be reconnected, as this net can't be the
    parent of any
//aggregate net (assumption 2)
    //get the list of all heterogeneous nets of which this net is
        a part.
    //For each element net 'i' in the list
    foreach i(list) {
```

```
elementList=i->getMatchingHeterogeneousEle-
    mentsAndClear(this);
foreach ele(elementList) {
    //rewire the connection for each heterogeneous ele-
        ment (ele)
    //that has "this" net as its parent
    }
}
//clear the list of all heterogeneous nets of which this net
    is a part list.clear( );
}
```

EXAMPLE 3

Applying the pseudo code to the table shown in FIG. 5-2, the first NSR in set 0 (i.e., 'wa') is configured to become the parent heterogeneous element. Nets corresponding to 'wb', 'we', 'wi' become child heterogeneous_nets with 'wa' becoming the parent heterogeneous_element. Similarly, 'wd' becomes a heterogeneous child of 'wc', 'wg' becomes heterogeneous child of 'wf', and 'wi' becomes a heterogeneous child of 'wh'.

In the flattened hierarchy of NSRs, net actuals that are children of the parent NSR are shorted together. Using the flattened hierarchy, one memory location may be allocated to implement actuals that are shorted together. In this arrangement, updating of the shorted nets may be performed with fewer memory accesses and reduced processing time. Further, nets having only a few bits shorted do not need to be separated for individual bitwise handling of the shorted nets at simulation runtime. Further, by determining shorted nets during compilation, the shorting behavior may be modeled using fewer data structures than the previous approaches. In terms of performance, experimental simulation benchmarks have shown that runtime and the memory required for simulation remain fairly constant as the number of shorted nets in a HDL specification is increased. In contrast, simulation resulting from previous compilation methods shows a linear increase of runtime and the memory requirements. For instance, increasing nets from 4000 to 8000 to 12000, for some tested embodiments, surprisingly result in a runtime that remains constant at around 3 seconds, and a memory requirement that only increases from around 60 MB to around 97 MB. In comparison, previous methods can expect a runtime to increase from about 15 to 65 to 150 seconds, and memory requirements to increase from about 900 MB to about 1.8 GB to about 2.7 Gigs.

Figure 7:
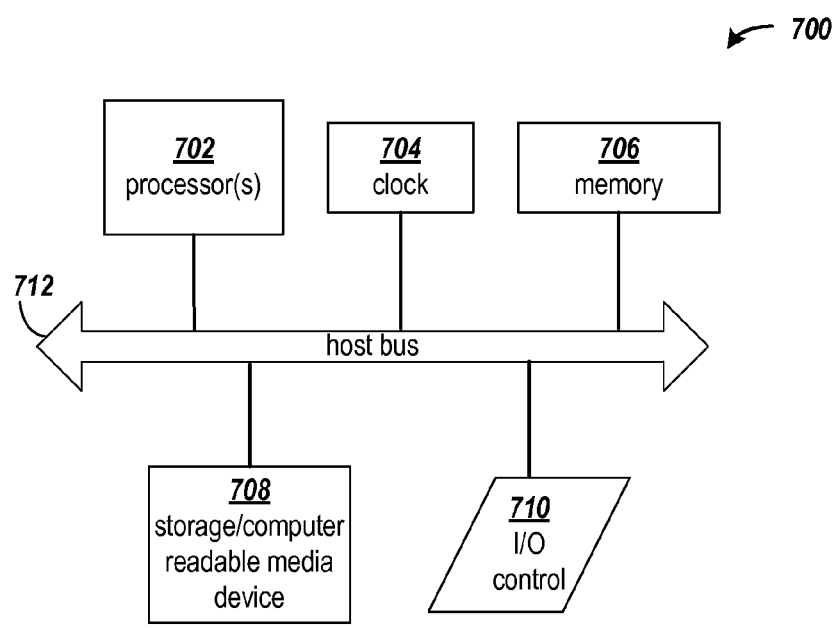
FIG. 7 shows a computing arrangement that may be configured to perform the processes of the various embodiments.

FIG. 7 shows a block diagram of an example computing arrangement that may be configured to implement the compilation and/or simulation processes described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 700 includes one or more processors 702, a clock signal generator 704, a memory unit 706, a storage unit 708, and an input/output control unit 710 coupled to a host bus 712. The arrangement 700 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 702 may be one or more general purpose processors, or a combination of one or more general purpose processors and suitable co-processors, or one or more specialized processors (e.g., RISC, CISC, pipelined, etc.).

The memory arrangement 706 typically includes multiple levels of cache memory, and a main memory. The storage arrangement 708 may include local and/or remote persistent storage, such as provided by magnetic disks (not shown), flash, EPROM, or other non-volatile data storage. The storage unit may be read or read/write capable. Further, the memory 706 and storage 708 may be combined in a single arrangement.

The processor arrangement 702 executes the software in storage 708 and/or memory 706 arrangements, reads data from and stores data to the storage 708 and/or memory 706 arrangements, and communicates with external devices through the input/output control arrangement 710. These functions are synchronized by the clock signal generator 704. The resource of the computing arrangement may be managed by either an operating system (not shown), or a hardware control unit (not shown). The embodiments may be applicable to a variety of systems for HDL simulation. Other aspects and embodiments will be apparent from consideration of the specification. It is intended that the specification and illustrated embodiments be considered as examples only, with a true scope of the embodiments being indicated by the following claims.

What is claimed is:

1. A method of compiling a hardware description language (HDL) specification for simulation of a circuit design, the method comprising using one or more processors to perform operations including:
    elaborating the circuit design from the HDL specification;
    determining non-blocking assignments in the elaborated circuit design;
    for each net to which one or more of the non-blocking assignments are sensitive, creating a corresponding data structure indicating each non-blocking assignment sensitive to the net; and
    generating simulation code that models the circuit design, the simulation code configured and arranged during runtime to:
        for each net to which one or more of the non-blocking assignments are sensitive, in response to the net being updated in a cycle of simulation, add the data structure corresponding to the net to a list; and
        in response to completing the cycle of simulation, for each data structure in the list:
            perform each non-blocking assignment indicated by the data structure; and
            remove the data structure from the list.

2. The method of claim 1, the operations further including:
    for each of the determined non-blocking assignments that is not sensitive to a net:
        creating a data structure indicating the non-blocking assignment; and
        in response to the non-blocking assignment not having a delay, adding the data structure corresponding to the net to the list.

3. The method of claim 2, the operations further including, for each of the determined non-blocking assignments that is not sensitive to a net, in response to the non-blocking assignment having a delay, adding the data structure to a second list.

4. The method of claim 3, wherein:
for each of the non-blocking assignments having a delay, the corresponding data structure indicates a simulation cycle in which the non-blocking assignment is to be executed; and
the simulation code is further configured and arranged to, during runtime, in response to completing the cycle of simulation, for each data structure in the second list indicating a simulation cycle that matches a next cycle to be simulated, remove the data structure from the second list and perform the non-blocking assignment indicated by the data structure.

5. The method of claim 1, wherein the simulation code is further configured and arranged to, during runtime, perform a next cycle of simulation in response to completion of the non-blocking assignment and completion of execution of the processes sensitive to the non-blocking assignment for each data structure in the list.

6. The method of claim 1, wherein generation of the simulation code that models the circuit design includes, creating a respective transaction function for each net in the elaborated circuit design, the transaction function configured to:
schedule execution of each process that is sensitive to the net; and
for each net that the non-blocking assignments are sensitive to, add the corresponding data structure to the list.

7. The method of claim 1, wherein:
the list is a linked list; and
the adding of the data structure corresponding to the net to the list includes adding the data structure to the linked list.

8. The method of claim 1, wherein the creating of a corresponding data structure indicating each non-blocking assignment sensitive to the net includes adding each of the non-blocking assignments sensitive to the net to a linked list of the data structure.

9. A method of compiling a hardware description language (HDL) specification for simulation of a circuit design, the method comprising using one or more processors to perform operations including:
elaborating the circuit design from the HDL specification;
determining non-blocking assignments in the elaborated circuit design;
for each net to which one or more of the non-blocking assignments are sensitive, creating a corresponding data structure indicating each non-blocking assignment sensitive to the net;
for each instance of a module in which two or more nets are shorted together by the module, determining respective first sets of nets shorted by the instance;
converting the first sets of nets into second sets of nets, wherein sets of the first sets having nets in common are merged into one set of the second sets of nets;
for each of the second sets of nets, assigning a respective memory location to store a value of the set of nets at runtime; and
generating simulation code that models the circuit design, the simulation code configured and arranged to, during runtime:
for each net in the second sets of nets, store a value of the net in the memory location assigned to the corresponding to the one of the second sets of nets and first set of nets that is not merged that includes the net; and
for each net to which one or more of the non-blocking assignments are sensitive, in response to the net being updated in a cycle of simulation, add the data structure corresponding to the net to a list; and
in response to completing the cycle of simulation, for each of the data structures in the list:
perform each non-blocking assignment indicated by the data structure; and
remove the data structure from the list.

10. The method of claim 9, wherein:
the HDL specification indicates formals that are declarations of inputs and outputs of each instance, actuals that are signal values passed to and from the formals during simulation runtime, and nets connecting the formals to the actual;
the identifying of the first sets includes determining formals that are connected to multiple actuals; and
the merging sets of the first sets of nets having nets in common to produce the second sets of nets includes:
for each formal and actual connected to the first sets of nets, creating a respective data structure;
for each of the first sets of nets, linking the data structures of the actuals included in the first set in a hierarchy having one data structure in the set as a parent of the other data structures; and
traversing the linked data structures and modifying the linking of the traversed data structures to reduce a depth of the hierarchy.

11. The method of claim 10, wherein:
each net in the first sets of nets is one of:
a heterogeneous net corresponding to a formal that shorts together multiple actuals;
a homogeneous net corresponding to a formal that is connected to only one actual;
a heterogeneous element corresponding to an actual that is shorted to another actual; or
a homogeneous element corresponding to an actual that is not shorted to another actual; and
the modifying of the linking of the data structures to reduce the depth of the hierarchy includes arranging the hierarchy into a hierarchy wherein none of the data structures corresponding to a heterogeneous element includes a data structure corresponding to a homogeneous net as a child.

12. The method of claim 9, the operations further including:
for each of the determined non-blocking assignments that is not sensitive to a net:
creating a data structure indicating the non-blocking assignment; and
in response to the non-blocking assignment not having a delay, adding the data structure corresponding to the net to the list.

13. The method of claim 12, the operations further including:
for each of the determined non-blocking assignments that is not sensitive to a net, in response to the non-blocking assignment having a delay, adding the data structure to a second list.

14. The method of claim 13, wherein:
for each of the non-blocking assignments having a delay, the corresponding data structure indicates a simulation cycle in which the non-blocking assignment is to be executed; and
the simulation code is further configured and arranged during runtime to, in response to completing the cycle of simulation, for each of the data structures in the second list indicating a simulation cycle matching the next cycle to be simulated, remove the data structure from the second list and perform the non-blocking assignment indicated by the data structure.

* * * * *